United States Patent [19]
Itoh et al.

[11] Patent Number: 4,823,174
[45] Date of Patent: Apr. 18, 1989

[54] BIPOLAR TRANSISTOR AND PROCESS OF FABRICATION THEREOF

[75] Inventors: Tadatsugu Itoh; Hideaki Kohzu; Yasuhiro Hosono, all of Tokyo, Japan

[73] Assignee: NEC Corporation, Japan

[21] Appl. No.: 205,573

[22] Filed: Jun. 8, 1988

Related U.S. Application Data

[63] Continuation of Ser. No. 843,177, Mar. 24, 1986, abandoned.

[30] Foreign Application Priority Data

Mar. 25, 1985 [JP] Japan .................................. 60-59957
Mar. 25, 1985 [JP] Japan .................................. 60-59958

[51] Int. Cl.$^4$ ........................................... H01L 29/72
[52] U.S. Cl. ........................................ 357/34; 357/16;
357/36; 357/48; 357/55; 357/56; 357/58; 357/90
[58] Field of Search ..................... 357/16, 34, 36, 48, 357/55, 56, 58, 90

[56] References Cited

U.S. PATENT DOCUMENTS 4,380,774 4/1983 Yoder ..................................... 357/16
4,611,388 9/1986 Pande .................................... 357/16

OTHER PUBLICATIONS

Asbeck et al, 8179 IEEE Electron Device Letters, vol. EDL-4, (1983), No. 4.

Primary Examiner—Edward J. Wojciechowicz
Attorney, Agent, or Firm—Laff, Whitesel, Conte & Saret

[57] ABSTRACT

A bipolar transistor comprising a first layer of a first semiconductor material having a first conductivity type, a second layer on the first layer, the second layer being of a second semiconductor material having a second conductivity type, the second semiconductor material having a bandgap less than that of the first semiconductor material, a third layer on the second layer, the third layer being of the second semiconductor material and having the first conductivity type, a first doped region in the first layer, the first doped region being of the first semiconductor material and being doped to be semi-insulating regions, and a second doped region in the third layer, the second doped region being of the second semiconductor material and being doped to the second conductivity type. The second layer has a portion forming an active base region and the third layer has a portion forming a collector region in contact with the active base region. The first doped region defines in the first layer an active emitter region in contact with the active base region and the second doped region forms a connecting base region electrically coupled with the active base region.

8 Claims, 9 Drawing Sheets

BIPOLAR TRANSISTOR AND PROCESS OF FABRICATION THEREOF

This application is a continuation of application Ser. No. 0/843,177, filed 3/24/86 now abandoned.

FIELD OF THE INVENTION

The present invention relates to semiconductor devices and, more particularly, to a heterojunction bipolar transistor device. The present invention further relates to a process of fabricating a semiconductor device, particularly, a heterojunction bipolar transistor device or a unit circuit such as an emitter-coupled logic composed of heterojunction bipolar transistors.

DESCRIPTION OF THE PRIOR ART

Semiconductor devices presently known and in use are broken down to three major categories of homogeneous pn junction devices, Schottky barrier devices and metal-oxide-semiconductor (MOS) devices. Typical of homogeneous pn junction devices are bipolar transistors. Bipolar transistors are contrasted by unipolar or field-effect transistors which may be of any of the homogeneous pn junction, Schottky barrier and metal-oxide-semiconductor configurations. The high-frequency performance of a unipolar transistors can be improved by microminiaturization of the gate of the device while that of a bipolar transistor improved by reducing the thickness of the base region of the device. In whichsoever case, it is important that the devices be designed and fabricated with a view to reducing the parasitic resistances and capacitances to be involved in the devices. For this purpose, it is of particular significance to reduce the source/gate and drain/gate resistances for transistors of the unipolar type and the base resistances and the emitter/base capacitances for bipolar transistors.

In a semiconductor integrated circuit composed of a number of transistors provided as component devices, unipolar transistors excel bipolar transistors for their smaller power dissipation rates but are inferior to the latter for their capabilities to drive loads. Where load driving capabilities are among preferential requirements of component devices forming a semiconductor integrated circuit, bipolar transistors are used almost exclusively over unipolar devices. Bipolar transistors are generally fabricated of silicon and provide high-frequency performances having limitations represented by cutoff frequencies of from 1giga hertz to 20 giga hertz as well known in the art.

BACKGROUND OF THE INVENTION

Vigorous research and development efforts are being thus made for integrated circuits composed of field-effect transistors using gallium-arsenide providing an electron mobility which is three to five times higher than that achievable by silicon. As well known in the art, field-effect transistors of gallium-arsenide provide higher cutoff frequencies as they are scaled down. The increased cutoff frequency will do justice to a semiconductor integrated circuit with a relatively small load requirement and a relatively low integration density. It is, however, presumed those skilled in the art that increasing the density of the integrated circuit as achieved by the miniaturization of the component devices might be detrimental to achievement of faster operation because of the low load driving capabilities of the field-effect transistors. There is, for this reason, a demand for transistors providing increased load driving capabilities or, more specifically, for bipolar transistors having improved cutoff frequency characteristics. A prime object of the present invention is to provide a bipolar transistor with an increased cutoff frequency and more adaptability to integration and a process of fabricating such a transistor.

SUMMARY OF THE INVENTION

In accordance with the present invention, there is provided a bipolar transistor comprising (a) a first layer of a first semiconductor material having a first conductivity type, (b) a second layer on the first layer, the second layer being of a second semiconductor material having a second conductivity type opposite to the first conductivity type, the second semiconductor material having an energy bandgap less than that of the first semiconductor material, (c) a third layer on the second layer, the third layer being of the second semiconductor material and having the first conductivity type, (d) a first doped region in the first layer, the first doped region being of the first semiconductor material and being doped to be semi-insulating regions, and (e) a second doped region in the third layer, the second doped region being of the second semiconductor material and being doped to the second conductivity type, (f) the second layer having a portion forming an active base region, the third layer having a portion forming a collector region in contact with the active base region, the first doped region defining in the first layer an active emitter region in contact with the active base region, the second doped region forming a connecting base region electrically coupled with the active base region.

In accordance with another outstanding aspect of the present invention, there is provided a process of fabricating a bipolar transistor, comprising the steps of (a) epitaxially forming a first layer of a first semiconductor material having a first conductivity type, (b) epitaxially forming on the first layer a second layer of a second semiconductor material having a second conductivity type opposite to the first conductivity type, the second layer having a portion for forming an active base region, the second semiconductor material having an energy bandgap less than that of the first semiconductor material, (c) epitaxially forming on the second layer a third layer of the second semiconductor material and having the first conductivity type, the third layer having a portion for forming a collector region in contact with the active base region, and (d) introducing a dopant of the second conductivity type into a portion of the third layer and through the second layer into a portion of the first layer, (e) heating the resultant structure for converting the doped portion of the first layer into a semi-insulating region and converting the doped portion of the third layer into a doped region having the second conductivity type, the semi-insulating region defining in the first layer an active emitter region in contact with the active base region, the doped region of the third layer forming a connecting base region electrically coupled with the active base region.

BRIEF DESCRIPTION OF THE DRAWINGS

The features and advantages of a transistor device according to the present invention will be more clearly appreciated from the following description taken in conjunction with the accompanying drawings in which like reference numerals designate similar or corresponding elements, portions and regions and in which:

FIGS. 3A to 3F are fragmentary cross sectional views showing major process steps of a process of fabricating another preferred embodiment of a semiconductor device according to the present invention;

DESCRIPTION OF THE PREFERRED EMBODIMENTS

A preferred example of a process of fabricating a transistor device in accordance with the present invention will be hereinafter described with reference to FIGS. 1A to 1E of the drawing.

Figure 1A:
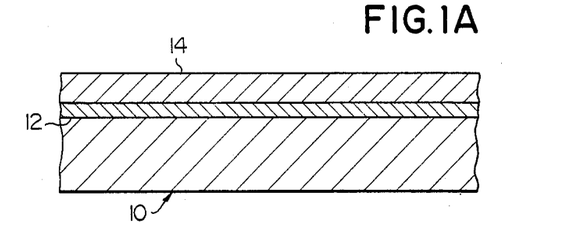
FIGS. 1A to 1E are fragmentary cross sectional views showing major process steps of a process of fabricating a preferred embodiment of a transistor device according to the present invention.

The shown example of a process according to the present invention starts with preparation of an n-type epilayer 10 of gallium arsenide (hereinafter referred to as GaAs). On this n-type GaAs epilayer 10 is grown a p-type monocrystalline germanium epilayer 12 by, for example, molecular beam epitaxy (MBE), whereupon an n-type monocrystalline germanium epilayer 14 is grown on the p-type germanium epilayer 12 also by molecular beam epitaxy. FIG. 1A shows the semiconductor structure thus obtained, wherein a heterojunction is formed between the n-type GaAs epilayer 10 which is to result, in part, in an emitter region and the p-type germanium epilayer 12 which is to result, in part, in an active base region as the process advances.

Figure 1B:
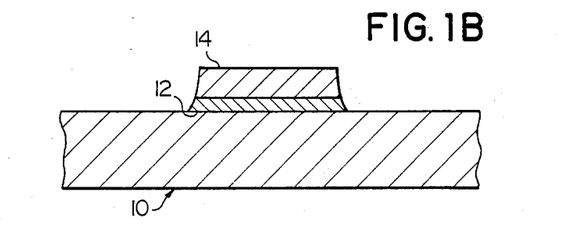
Figure 1C:
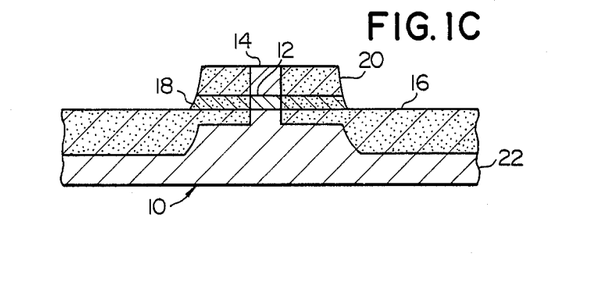

Though not shown in the drawings, a photoresist is spun on to the surface of the upper n-type germanium epilayer 14 and the resultant photoresist coating is patterned and etched to define a desired device region of the transistor device to be fabricated. The upper two germanium epilayers 12 and 14 are then etched away with the remaining photoresist coating used as a mask to leave the epilayers 12 and 14 in mesa form as illustrated in FIG. 1B. A central portion of the upper n-type germanium epilayer 14 of the land thus formed on the n-type GaAs epilayer 10 is covered with a mask (not shown) defining a collector region of the transistor device to be fabricated. A p-type dopant such as boron is injected by ion implantation into the unmasked areas of the epilayers 12 and 14 and the exposed area of the n-type GaAs epilayer 10 surrounding the land of the germanium epilayers 12 and 14 and further into an upper surface portion of the area of the GaAs epilayer 10 which underlies the p-type germanium epilayer 12. In this instance, the energy to be used for the ion implantation is selected to assure the p-type dopant to reach into the upper surface portion of the area of the GaAs epilayer 10 underlying the p-type germanium epilayer 12. Thus, the n-type GaAs epilayer 10 has a doped surface region 16, the lower p-type germanium epilayer 12 has a doped region 18, and the upper n-type germanium epilayer 14 has a doped region 20, in addition to an original unimplanted lower layer region 22 underlying the doped surface region 16 of the GaAs epilayer 10, as shown in FIG. 1C. As will be apparent from FIG. 1C, the doped surface region 16 in the GaAs epilayer 10 has a shallow portion which is underlying the doped regions 18 and 20 and has a deep portion surrounding the shallow portion.

Figure 1D:
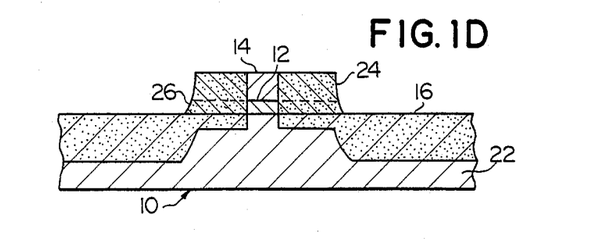
Figure 1E:
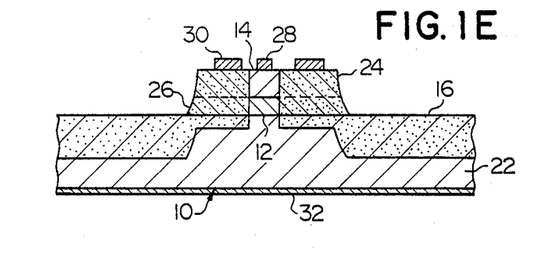

The resultant semiconductor structure is annealed at a temperature within the range of from 400° C. to 600° C. so that the atoms of boron injected into each of the regions 18 and 20 are thermally activated. The doped region 20 of the upper n-type germanium epilayer 14 is thus converted into a p-type germanium region 24, and the doped region 18 of the lower p-type germanium epilayer 14 becomes a heavily doped p-type germanium region 26, as shown in FIG. 1D. These coextensive or aligned p-type germanium regions 24 and 26 are to form in combination a base contact or connecting portion of the transistor device to be fabricated. The surface region 16 doped with boron of the n-type GaAs epilayer 10 becomes semi-insulating as a result of the injection of the dopant due to the implant damage caused therein. The semi-insulating GaAs region 16 remain as such after the annealing process because the annealing temperature lower than 600° C. is short of activating the atoms of boron injected into the region 16 of the n-type GaAs epilayer 10 and because the implant damage as caused by the implantation of boron into the GaAs epilayer 10 remains unrelieved by the annealing process. A collector region is defined by the region surrounded by the doped p-type germanium region 24 of the initial n-type germanium epilayer 14, and an active base region is defined by the region surrounded by the heavily doped p-type germanium region 26 of the initial p-type germanium epilayer 12. That portion of the region 22 of the initial n-type GaAs epilayer 10 which directly underlies this active base region and which is circumscribed by the shallow portion of the semi-insulating surface region 16 of the GaAs epilayer 10 defines the effective width of the emitter region, as will be seen from FIG. 1D. The effective width of the emitter region is thus dictated by the boundary of the semi-insulating surface region 16 of GaAs contiguous with the emitter region directly underlying the active base region 12 of p-type germanium. An n-p-n heterojunction bipolar transistor (HBT) is completed with a collector electrode layer 28 formed on the collector region 14, a base electrode layer 30 formed on the base contact or connecting portion provided by the aligned p-type germanium regions 24 and 26, and an emitter electrode layer 32 formed on the reverse surface of the n-type GaAs epilayer 10 as shown in FIG. 1E. These electrode layers may be formed by a metalization process with, for example, a gold-germanium alloy. The bipolar transistor has a heterogeneous emitter-base junction interface between the n-type GaAs epilayer 10 and the p-type germanium region 12.

In the heterojunction bipolar transistor thus fabricated, the bandgap of the emitter region 22 of the n-type GaAs epilayer 10 is wider than that of the p-type germanium epilayer 12 forming the active base region so that the edges of the conduction and valence bands of the two layers have discontinuities at the heterojunction interface between the layers. The discontinuity in the energy level at the band edge of the conduction band results in an initial velocity of movement of the electrons to be transported from the emitter region 14 into the active base region 12 of the transistor. This initial velocity reduces the period of time for which the electrons travel through the overall base region and thus contributes to improvement of the high-frequency performance of the device. On the other hand, the discontinuity in the energy level at the band edge of the valence band results in creation of a barrier to the movement of holes which attempt to enter the emitter region 14 from the active base region 12 and contributes to reduction in the recombination of holes and electrons within the emitter region 14, thereby providing an increased electron pumping efficiency across the heterojunction interface between the layers 12 and 14.

As a result of the annealing process which is carried out subsequently to the ion implantation with boron, the atoms of boron injected into the defined region of the initial n-type germanium epilayer 14 convert the doped region 20 of the epilayer 14 into the p-type germanium region 24 and the atoms of boron injected into the defined region the initial p-type germanium epilayer 12 convert the doped region 18 of the epilayer 12 into the $p^+$-type germanium region 26. On the other hand, the atoms of boron injected into the initial n-type GaAs epilayer 10 render the doped surface region 16 semi-insulating and are thus conducive to reducing the effective area of the base-emitter junction and the base spreading resistance of the device, viz., the resistance through the extrinsic, viz., contact or connecting base portion formed by the aligned p-type germanium regions 26 and 24. The combination of these effects result in significant reduction in the capacitance of the base-emitter junction and accordingly permits achievement of faster operation in the device.

The bipolar transistor device fabricated as hereinbefore described is further advantageous in that the active emitter region is aligned with the collector region across the active base region and is thus substantially coextensive with the collector region due to the formation of the boron-implanted semi-insulating region around the active emitter region.

Figure 2A:
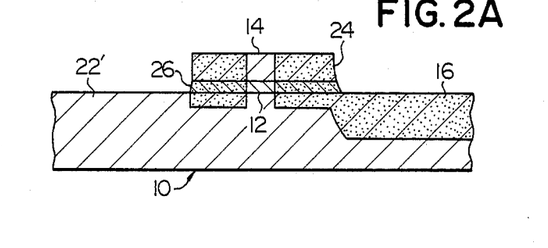
FIGS. 2A and 2B are fragmentary cross sectional views showing major process steps of a process of fabricating a modification of the transistor device fabricated by the process shown in FIGS. 1A to 1E.
Figure 2B:
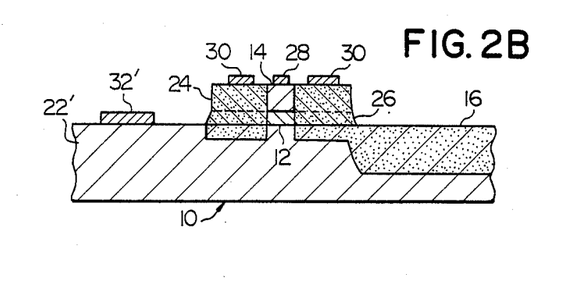

Because, furthermore, of the fact that the emitter electrode layer 32 is attached to the reverse surface of the n-type GaAs epilayer 10, the bipolar transistor, when used in the form of grounded-emitter connection, produces a limited emitter inductance which would otherwise impair the high-frequency performance characteristics of the device. If desired, however, a bipolar transistor according to the present invention may have an emitter electrode layer or two or more emitter electrode regions provided on the upper surface of the device structure. For this purpose, the fabrication process step resulting in the structure shown in FIG. 1B may be followed by formation of a mask patterned to cover not only the central portion of the upper n-type germanium epilayer 14 as described but also at least one portion of the n-type GaAs epilayer 10 within the area in which the transistor device is to be fabricated. A p-type dopant such as boron is then injected by ion implantation into the unmasked areas of the p-type and n-type germanium epilayers 12 and 14, the upper surface portion of that area of the GaAs epilayer 10 which underlies the p-type germanium epilayer 12, and the exposed area of the GaAs epilayer 10 as shown in FIG. 2A. Thus, the n-type GaAs epilayer 10 has an undoped region 22' partly exposed at the upper surface of the epilayer 10 as well as the doped surface region 16 of GaAs in part underlying the doped germanium regions 18 and 20 and in part exposed at the upper surface of the epilayer 10. The resultant structure is annealed as discussed previously so that the atoms of the p-type dopant injected into each of the regions 18 and 20 are activated to form the p-type germanium region 24 and the heavily doped p-type germanium region 26, respectively, as shown in FIG. 2B. An n-p-n bipolar transistor is thus obtained with a collector electrode layer 28 formed on the collector region 14, a base electrode layer region 30 formed on the active base region 12 and an emitter electrode layer region 32' formed on the upper surface of the n-type GaAs epilayer 10.

The process according to the present invention as hereinbefore described can be modified for the fabrication of an emitter-coupled logic (ECL) circuit. Some of the steps required to carry out in such a process are shown in FIGS. 3A to 3E of the drawings.

Figure 3A:
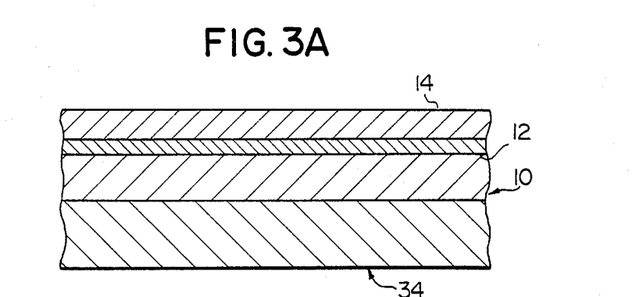

The process shown in FIGS. 3A to 3E starts with preparation of a monocrystalline GaAs substrate 34 doped with, for example, chromium to be semi-insulating. An epilayer of GaAs is grown on this semi-insulating GaAs substrate 34 and doped with, for example, silicon to a carrier concentration of $1 \times 10^{18}$ atoms/cm$^{-3}$ to form an n-type GaAs epilayer 10. On this n-type GaAs epilayer 10 is grown a monocrystalline germanium epilayer 12 to a thickness of 0.1 micron by molecular beam epitaxy and is doped with, for example, boron to a carrier concentration of $1 \times 10^{17}$ atoms/cm$^{-3}$. Thereupon, a monocrystalline germanium epilayer 14 is grown on the p-type germanium epilayer 12 to a thickness of 0.6 micron also by molecular beam epitaxy and is doped with, for example, phosphorus to a carrier concentration of $1 \times 10^{16}$ atoms/cm$^{-3}$. FIG. 3A shows the semiconductor structure thus obtained. In the structure shown in FIG. 3A, a heterojunction is formed between the n-type GaAs epilayer 10 which is to result, in part, in two collector regions and the p-type germanium epilayer 12 which is to result, in part, in two active base regions as the process advances.

Figure 3B:
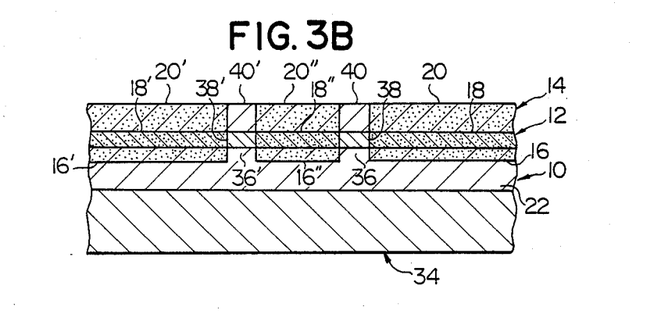

A photoresist is then spun on to the surface of the upper n-type germanium epilayer 14 to form a photoresist coating (not shown). The photoresist coating is patterned and etched to define two collector regions on both sides of a common emitter region of the emitter-coupled logic to be fabricated. A p-type dopant such as boron is injected by ion implantation into the unmasked areas of the epilayers 12 and 14 and far into surface portions of the n-type GaAs epilayer 10 underlying the unmasked areas of the germanium epilayers 12 and 14. In this instance, the energy to be used for the ion implantation is selected to assure the p-type dopant to penetrate into the upper surface portions of the GaAs epilayer 10 underlying the germanium epilayers 12 and 14. As a consequence of this ion implantation step, the n-type GaAs epilayer 10 has three doped surface regions 16, 16' and 16", the lower p-type germanium epilayer 12 has three doped regions 18, 18' and 18", and the upper n-type germanium epilayer 14 has three doped regions 20, 20' and 20" in addition to an original unimplanted lower layer region 22 of the GaAs epilayer 10, as shown in FIG. 3B. The doped surface regions 16, 16' and 16" of the n-type GaAs epilayer 10 are separated from one another across portions 36 and 36' of the unimplanted lower layer region 22 of the epilayer 10. The doped regions 18, 18' and 18" of the lower p-type germanium epilayer 12 overlie the doped surface regions 16, 16' and 16", respectively, of the GaAs epilayer 10 and are separated from one another across unimplanted regions 38 and 38' of the germanium epilayer 12. The doped regions 20, 20' and 20" of the upper n-type p-type germanium epilayer 14 overlie the doped regions 18, 18' and 18", respectively, of the lower p-type germanium epilayer 12 and are separated from one another across unimplanted regions 40 and 40' of the germanium epilayer 14. The unimplanted region 22 of the n-type GaAs epilayer 10 is to result in the common emitter region, and the unimplanted regions 38 and 38' of the p-type germanium epilayer 12 are to result in the active base regions, respectively, of the emitter-coupled logic circuit. The unimplanted regions 40 and 40' of the n-type germanium epilayer 14 are to result in the collector regions, respectively, of the emitter-coupled logic circuit. Implantation of boron far into the n-type GaAs epilayer 10 to form the doped surface regions 16, 16' and 16" in the epilayer 10 as discussed above is of particular importance since the geometries, viz., the width and length of the common emitter region to be formed are dictated by the geometries, viz., the width and length of the two collector regions to result from the unimplanted regions 40 and 40', respectively, of the n-type germanium epilayer 14.

Figure 3C:
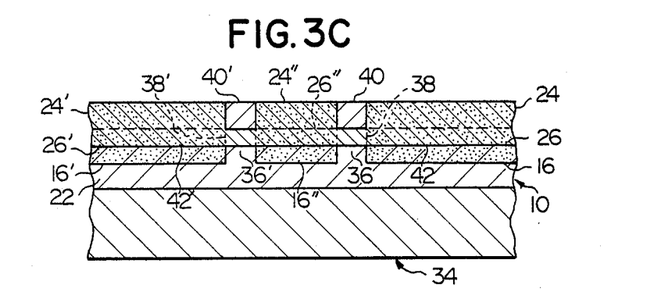

The resultant semiconductor structure is annealed at a temperature within the range of from 400° C. to 600° C. so that the atoms of boron injected into the regions 18, 18' and 18" of the initial p-type germanium epilayer 12 and the regions 20, 20' and 20" of the initial n-type germanium epilayer 14 are thermally activated. The doped regions 20, 20' and 20" of the initial n-type germanium epilayer 14 are thus converted into p-type germanium regions 24, 24' and 24", respectively, and the doped regions 18, 18' and 18" of the initial p-type germanium epilayer 14 become heavily doped p-type germanium regions 26, 26' and 26", respectively, as shown in FIG. 3C. The aligned p-type regions 24 and 26 form in combination a base contact or connecting region 42 of one of the transistors to form the emitter-coupled logic and, likewise, the aligned p-type regions 24' and 26' form in combination a base contact or connecting region 42' of the other transistor of the emitter-coupled logic. On the other hand, the regions 16, 16'and 16" doped with boron of the n-type GaAs epilayer 10 are rendered semi-insulating by the injection of the dopant due to the implant damage caused therein. As noted previously, these semi-insulating GaAs regions remain as such after the annealing process because the atoms of boron injected into these regions can not be activated by the annealing at a temperature lower than 600° C. and because the implant damage as caused by the implantation of boron into the GaAs epilayer 10 remains unrelieved by the annealing process, as previously noted. These semi-insulating GaAs regions 16, 16' and 16" separate the base contact or connecting regions 42 and 42' from the unimplanted emitter-forming region 22 of the n-type GaAs epilayer 10.

Figure 3D:
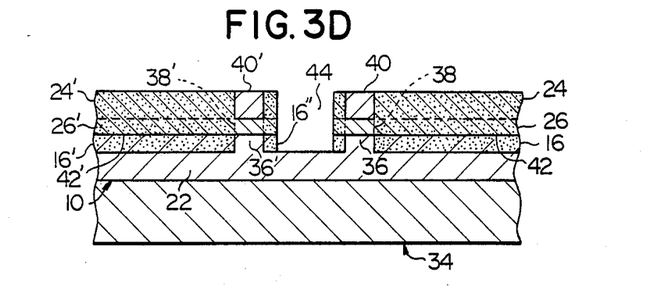
Figure 3E:
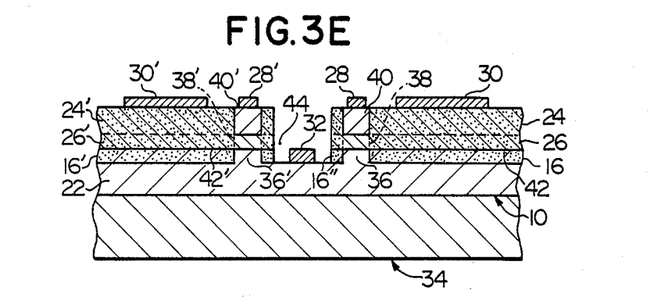
Figure 4:
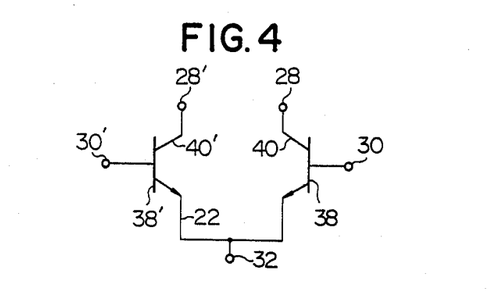
FIG. 4 is a schematic view showing the equivalent circuit representative of the emitter-coupled logic provided by the semiconductor device fabricated by the process shown in FIGS. 3A to 3F.

A photoresist is then spun on to the surface of the resultant structure to form a photoresist coating (not shown) on the surface of the toplevel layer forming the regions 24, 24' and 24" and regions 42 and 42'. The photoresist coating is patterned and etched to define a desired emitter electrode region through the region 24" between the collector-forming regions 40 and 40' of the toplevel layer. The remaining photoresist coating is used as a mask to etch the toplevel layer for forming a trench 44 extending through the aligned p-type germanium regions 24" and 26" and the semi-insulating GaAs region 16" to reach the surface of the unimplanted emitter-forming region 22 of the initial n-type GaAs epilayer 10 as shown in FIG. 3D. The trench 44 thus formed has its bottom surrounded by a remaining filament of the semi-insulating GaAs region 16" so that the width of the emitter region to be formed below the trench 44 might not be reduced as a result of the formation of the trench 44. A pair of n-p-n heterojunction bipolar transistors are thus completed by a metalization process with, for example, a gold-germanium alloy. Thus, collector electrode regions 28 and 28' are formed on the unimplanted regions 40 and 40' of the initial n-type germanium layer 14 and base electrode regions 30 and 30' are formed on the p-type germanium regions 24 and 24' forming part of the base contact or connecting portions of the device. An emitter electrode layer 32 is formed on the exposed surface of the unimplanted region 22 of the initial n-type GaAs epilayer 10 below the trench as shown in FIG. 3E. These two bipolar transistors form an emitter-coupled logic circuit having the collector regions 40 and 40' separate from each other across the trench 44, the active base regions 38 and 38' also separate from each other across the trench 44, and common emitter region 22 below the trench 44, as shown in FIG. 4. Each of these two bipolar transistors has a heterogeneous emitter-base junction between the emitter region 22 of n-type GaAs and each of the base regions 38 and 38' of p-type germanium.

FIGS. 5A to 5F of the drawings show the steps of a modification of the fabrication process hereinbefore described with reference to FIGS. 3A to 3E and are also useful for the fabrication of an emitter-coupled logic circuit.

Figure 5A:
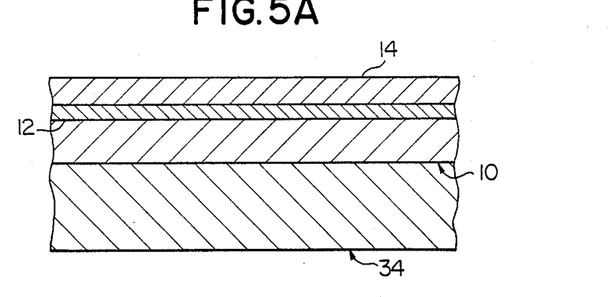
FIGS. 5A to 5E are fragmentary cross sectional views showing major process steps of a process of fabricating a modification of the semiconductor device fabricated by the process shown in FIGS. 3A to 3F.

The process shown in FIGS. 5A to 5F starts with preparation of a monocrystalline semi-insulating GaAs substrate 34 having an n-type GaAs epilayer 10, a p-type germanium epilayer 12 and a n-type germanium epilayer 14 as shown in FIG. 5A. The semi-insulating GaAs substrate 34, n-type GaAs epilayer 10 and p-type and n-type germanium epilayers 12 and 14 are all similar to those used in the process described with reference to FIGS. 3A to 3E with the GaAs epilayer 10 and the germanium epilayers 12 and 14 also formed by molecular beam epitaxy.

Figure 5B:
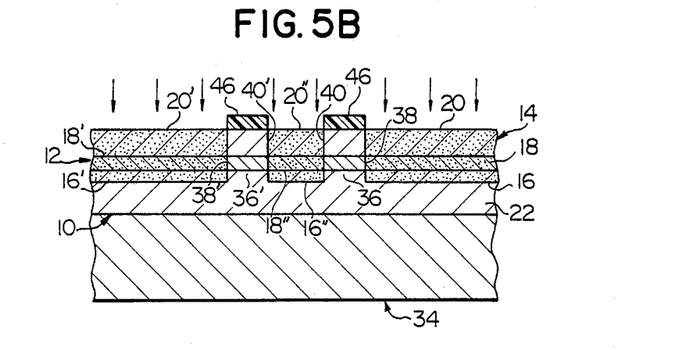

A photoresist is then spun on to the surface of the upper n-type germanium epilayer 14 to form a photoresist coating 46 as shown in FIG. 5B. The photoresist coating 46 is patterned and etched to define two collector regions on both sides of a common emitter region of the emitter-coupled logic to be fabricated. With the patterned photoresist coating 46 used as a mask, a p-type dopant such as boron is injected by ion implantation into the unmasked areas of the epilayers 12 and 14 and far into upper surface portions of the area of the GaAs epilayer 10 which underlie the unmasked areas of the germanium epilayers 12 and 14. As in the process described with reference to FIGS. 3A to 3E, the energy to be used for the ion implantation is selected to assure the p-type dopant to penetrate into the upper surface portion of the area of the GaAs epilayer 10 underlying the p-type germanium epilayer 12. In the process herein shown, it is further important that the penetration depth of the ions injected into the semiconductor structure be controlled so that the ions will not penetrate throughout the thickness of the n-type GaAs epilayer 10 and reach the semi-insulating GaAs substrate 34. As a result of this ion implantation step, the n-type GaAs epilayer 10 has three doped surface regions 16, 16' and 16", the lower p-type germanium epilayer 12 has three doped regions 18, 18' and 18", and the upper n-type germanium epilayer 14 has three doped regions 20, 20' and 20" in addition to an original unimplanted lower layer region 22 of the GaAs epilayer 10, as shown in FIG. 5B. The doped surface regions 16, 16' and 16" of the n-type GaAs epilayer 10 are separated from one another across portions 36 and 36' of the unimplanted lower layer region 22 of the epilayer 10. The doped regions 18, 18' and 18" of the lower p-type germanium epilayer 12 overlie the doped surface regions 16, 16' and 16", respectively, of the GaAs epilayer 10 and are separated from one another across unimplanted regions 38 and 38' of the germanium epilayer 12. The doped regions 20, 20' and 20" of the upper n-type p-type germanium epilayer 14 overlie the doped regions 18, 18' and 18", respectively, of the lower p-type germanium epilayer 12 and are separated from one another across unimplanted regions 40 and 40' of the germanium epilayer 14. The photoresist mask 46 is stripped off upon completion of the ion implantation step.

Figure 5C:
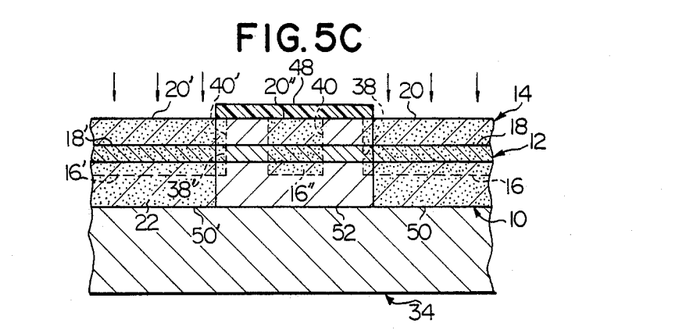

In the modified process according to the present invention, ion implantation step is for a second time carried out immediately following the first implantation step. A photoresist mask 48 is now used which is patterned to cover not only the collector regions but also the common emitter region of the emitter-coupled logic to be fabricated, as shown in FIG. 5C. Using this patterned photoresist mask 48, a p-type dopant of the same type as used in the first implantation step such as boron is implanted into the unmasked areas of the epilayers 12 and 14 and those portions of the GaAs epilayer 10 which underlie the unmasked areas of the epilayers 12 and 14. In this second ion implantation step, the energy to be used is selected to assure the dopant to reach the interface between the semi-insulating GaAs substrate 34 and the overlying n-type GaAs epilayer 10. Thus, the initial n-type GaAs epilayer 10 has doped regions 50 and 50' on both sides of a region aligned with the photoresist mask 48. The photoresist mask 48 is removed when the ion implantation is complete.

Figure 5D:
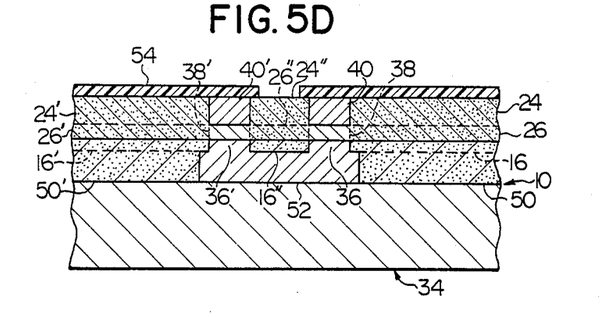

The resultant semiconductor structure is annealed at a temperature within the range of from 400° C. to 600° C. to activate the atoms of boron injected into the regions 18 and 18' of the p-type germanium epilayer 12 and the regions 20 and 20' of the n-type germanium epilayer 14 by the first and second ion implantation steps and the atoms of boron injected into the regions 18" and 20" of the p-type and n-type germanium epilayers 12 and 14 by the first ion implantation step. The doped regions 20, 20' and 20" of the initial n-type germanium epilayer 14 are thus converted into p-type germanium regions 24, 24' and 24", respectively, and the doped regions 18, 18' and 18" of the initial p-type germanium epilayer 14 become heavily doped p-type germanium regions 26, 26' and 26', respectively, as shown in FIG. 5D. The aligned p-type regions 24 and 26 form a base contact or connecting region 42 and, likewise, the aligned p-type regions 24' and 26' form a base contact or connecting region 42'. On the other hand, the regions 50, 50' and 16" doped with boron of the n-type GaAs epilayer 10 are rendered semi-insulating by the implantation step or steps and remain as such after the annealing process, for the reasons explained previously. The semi-insulating regions 50 and 50' of the n-type GaAs epilayer 10 have defined therebetween an unimplanted n-type GaAs region 52 which underlies the collector and common emitter forming regions of the initial germanium epilayers 12 and 14.

Figure 5E:
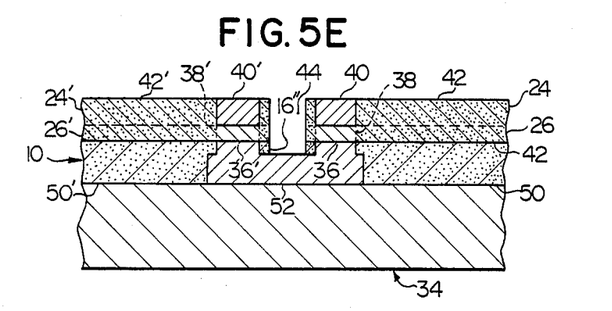
Figure 5F:
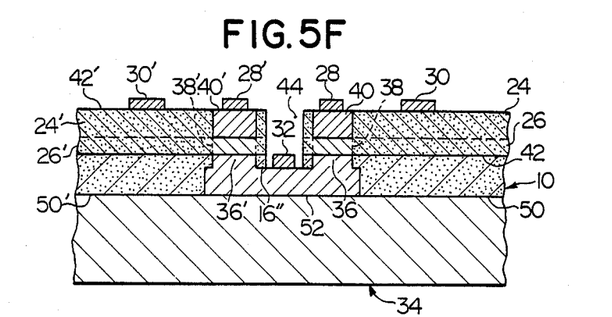

A photoresist is then spun on to the surface of the resultant structure to form a photoresist coating 54 on the surface of the toplevel layer forming the regions 24, 24' and 24" and regions 42 and 42'. The photoresist coating 54 is patterned and etched to define a desired emitter electrode region through the region 24" between the collector-forming regions 40 and 40' of the toplevel layer as shown in FIG. 5D. The remaining photoresist coating 54 is used as a mask to etch the toplevel layer for forming a trench 44 extending through the aligned p-type germanium regions 24" and 26" and the semi-insulating GaAs region 16" to reach the surface of the unimplanted emitter-forming region 52 of the initial n-type GaAs epilayer 10 as shown in FIG. 5E. The trench 44 thus formed has its bottom surrounded by a remaining filament of the semi-insulating GaAs region 16" so that the width of the emitter region to be formed below the trench 44 might not be reduced as a result of the formation of the trench 44. A metalization process with, for example, a gold-germanium alloy is then performed to have collector electrode regions 28 and 28' formed on the unimplented regions 40 and 40' of the initial n-type germanium layer 14 and base electrode regions 30 and 30' formed on the p-type germanium regions 24 and 24' forming part of the base contact or connecting portions of the device. Furthermore, an emitter electrode layer 32 is formed on the exposed surface of the unimplanted region 52 of the initial n-type GaAs epilayer 10 below the trench 44. A pair of n-p-n heterojunction bipolar transistors are thus completed as shown in FIG. 3E and form an emitter-coupled logic circuit as shown in FIG. 4.

Each of the two bipolar transistors forming each of the emitter-coupled logic circuits fabricated by the process described with reference to FIGS. 3A to 3E and the process described with reference to FIGS. 5A to 5F has a heterogeneous emitter-base junction between the emitter region 22 to 52 of n-type GaAs and each of the base regions 38 and 38' of p-type germanium. The bandgap of the GaAs forming the emitter region 22 or 52 is approximately 1.42 eV and is thus wider than the bandgap of 0.74 of the germanium forming the active base regions 38 and 38'. The edges of the conduction and valence bands of the layers of GaAs and germanium have discontinuities at the heterojunction interface between the layers due to the difference in electronegativity between the two substances. The discontinuity in the energy level at the band edge of the conduction band results in an initial velocity of movement of the electrons to be transported from the emitter region 22 or 55 into the active base region 38/38' of each of the transistors. This initial velocity reduces the period of time for which the electrons travel through the overall base region 38-24-26/38'-24'-26' and thus contributes to improvement of the cutoff frequency and accordingly the high-frequency performance of each transistor device. On the other hand, the discontinuity in the energy level at the band edge of the valence band results in creation of a barrier to the movement of holes which attempt to enter the emitter region 22 or 52 from the active base region 38/38' and contributes to reduction in the recombination of holes and electrons within the emitter region 22 or 52 and accordingly in the current to result from the recombined carriers, thereby providing an increased electron pumping efficiency across the heterojunction and accordingly the current amplification factor of each device. Each of the transistors fabricated in accordance with the present invention thus provides a higher cutoff frequency and a larger load driving capability than homogeneous p-n junction bipolar transistors.

A heterojunction bipolar transistor fabricated in accordance with the present invention is further characterized for its contact or connecting base regions 42 and 42' in part resulting from the initial p-type germanium epilayer 12 which is doped with a p-type dopant to add to the carrier concentration in the layer. Thus, the transistor device has a graft base configuration contributing to reduction in the parasitic resistance through the base region. As well known in the art, it is inevitable in a silicon bipolar transistor device that a graft base configuration invites an increase in the parasitic capacitance of the base-emitter junction interface and thus impairs the performance quality of the device per se. Such a problem is eliminated in a heterojunction bipolar transistor fabricated in accordance with the present invention since the contact or connecting base regions 42 and 42' are isolated from the emitter region 22 or 52 by means of the initial n-type GaAs epilayer 10 which intervenes between the emitter region and the contact or connection base regions and which is rendered semi-insulating by the implant of a p-type dopant such as boron.

The overall configuration of the transistor device fabricated by the process described with reference to FIGS. 3A to 3E or FIGS. 5A to 5F is particularly useful for the construction of an emitter-coupled logic circuit having no interconnection between separate emitter regions. If desired, however, the transistor device which has been described as being to be used as an emitter-coupled logic as shown in FIG. 4 may be used as a single transistor having both of its bases interconnected and both of its collectors interconnected. Such a single transistor device will prove useful for high-frequency applications using 1 giga hertz or more.

Figure 6:
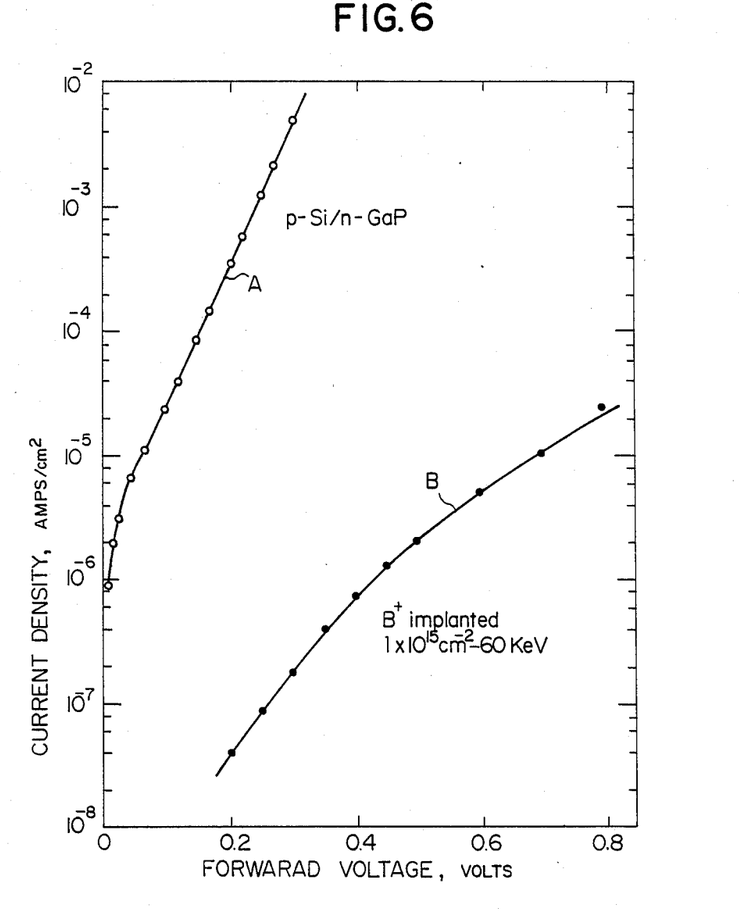
FIG. 6 is a graph showing forward voltage-current density characteristic curves for a heterojunction formed by p-type silicon and n-type gallium phosphide without implantation of boron (curve "A") and a heterojunction formed by p-type silicon and n-type gallium phosphide which is rendered semi-insulating with the implantation of boron (curve "B")
Figure 7:
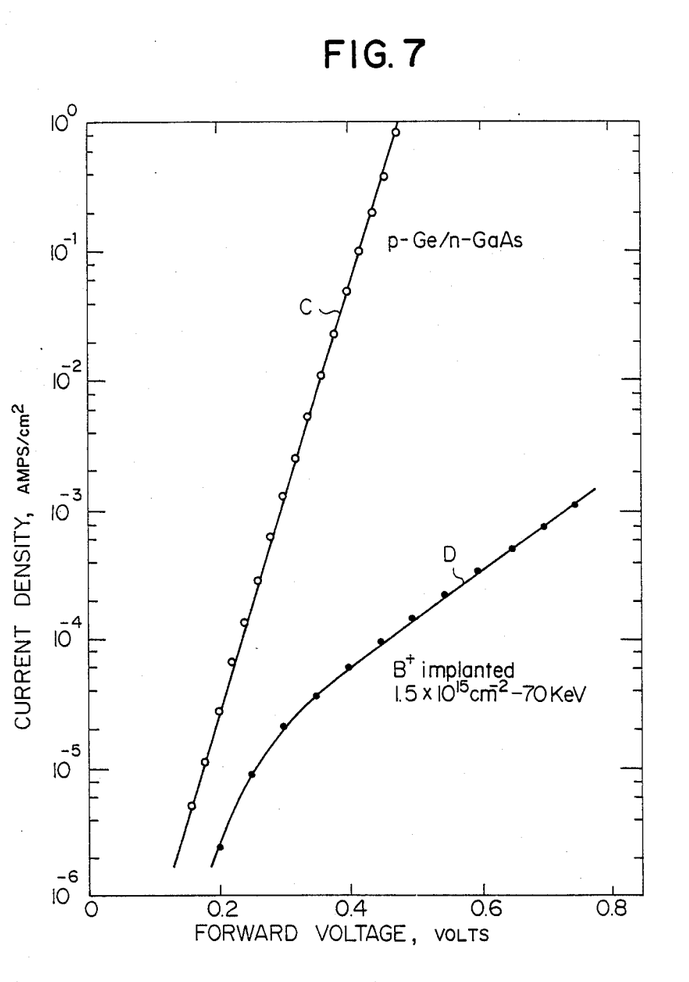
FIG. 7 is a graph showing curves similar to those of FIG. 6 but for a heterojunction formed by p-type germanium and n-type gallium-arsenide without implantation of boron (curve "C") and a heterojunction formed by p-type germanium and n-type gallium-arsenide rendered semi-insulating with the implantation of boron (curve "D")
Figure 8:
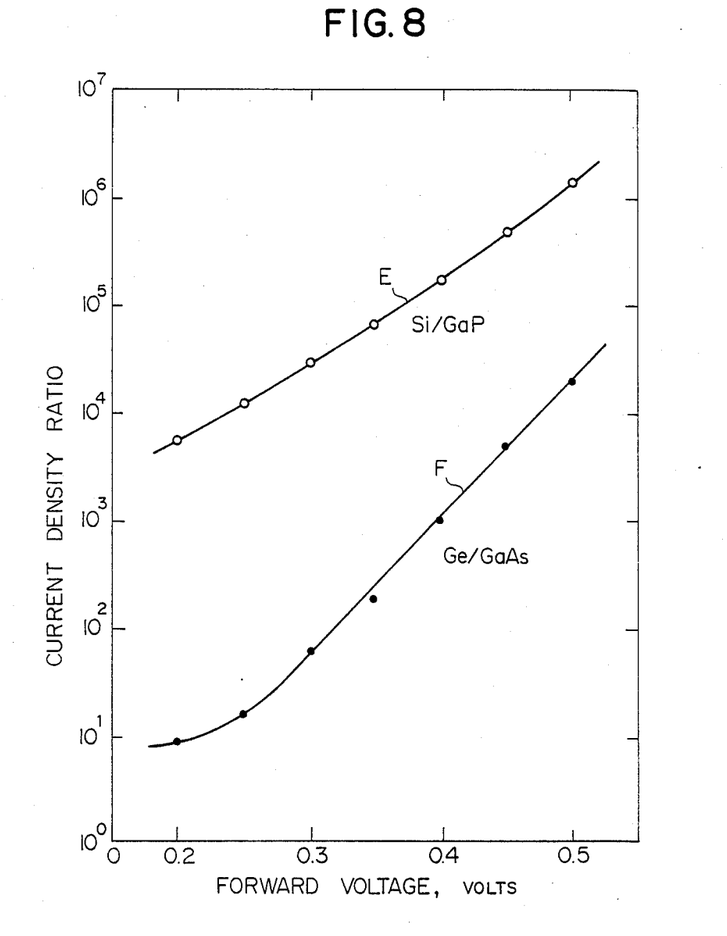
FIG. 8 is a graph showing the relationship between the forward voltage and the ratio of the current density achieved without implantation of a p-type dopant versus the current density achieved with implanmtation of a p-type dopant for the combination of p-type silicon and n-type gallium phosphide (curve "E") and the combination of p-type germanium and n-type gallium-arsenide (curve "F").

While it has been assumed that the heterojunction in a transistor device proposed by the present invention is to be formed by the combination of GaAs and germanium, an essentially similar effect will be achieved by the use of the combination of gallium phosphide (GaP) in substitution for GaAs and silicon in lieu of germanium. Using the combination of galium phosphide and silicon will particularly advantageous in an emitter-coupled logic circuit fabricated as by the process described with reference to FIGS. 5A to 5F. The emitter-coupled logic circuit fabricated by the fabrication process therein shown is surrounded by the boron-implanted semi-insulating regions 50 and 50' and is thereby isolated from another device or another device combination which may be fabricated on the same substrate. FIG. 6 of the drawings shows forward voltage-current density characteristic curves "A" and "B" for a heterojunction formed by p-type silicon and n-type gallium phosphide without implantation of boron and a heterojunction formed by p-type silicon and n-type gallium phosphide which is rendered semi-insulating with the implantation of boron. FIG. 7 shows similar curves "C" and "D" for a heterojunction formed by p-type germanium and n-type GaAs without implantation of boron and a heterojnction formed by p-type germanium and n-type GaAs rendered semi-insulating with the implantation of boron. From comparison between FIGS. 6 and 7 it will be seen that the combination of p-type silicon and n-type gallium phosphide is capable of achieving reduction of the order of four digits in the current density by the implantation of boron and is thus more advantageous for device isolation than the combination of p-type germanium and n-type GaAs. On the other hand, FIG. 8 of the drawings shows the relationship between the forward voltage and the ratio of the current density achieved without implantation of boron versus the current density achieved with implantation of boron for the combination of p-type silicon and n-type gallium phosphide as indicated by curve "E" and the combination of p-type germanium and n-type GaAs as indicated by curve "F". These curves "E" and "F" evidence that the combination of p-type silicon and n-type gallium phosphide for device isolation purposes than the combination of p-type germanium and n-type GaAs where implantation with boron is used.

What is claimed is:
1. A bipolar transistor comprising
 (a) an emitter region of a first semiconductor material doped to a first conductivity type,
 (b) a semi-insulating region of the first semiconductor material doped to be semi-insulating, said seminsulating region having a portion circumscribing a portion of said emitter region,
 (c) an active base region directly overlying, substantially aligned and coextensive with said emitter region; said active base region being of a second semiconductor material and being doped to be a second conductivity type which is opposite to said first conductivity type, said second semiconductor material having an energy and gap which is less than an energy bandgap of said first semiconductor material,
 (d) a collector region directly overlying, substantially alignedand extensive with said active base region; said collector region being of said second semiconductor material and being doped to be said first conductivity type, and
 (e) a base contact region on said semi-insulating region, the base contact region being of said second semiconductor material being doped to said second conductivity type to a concentration which is higher than a concentration to which said active base region is doped, said base contact region surrounding said active base region and said collector region, said collector region and said base contact region having respective surfaces which are substantially flush with each other and said emitter region and said base contact region forming a substantial p-n junction therebetween.

2. A bipolar transistor comprising
   (a) an emitter layer of a first semiconductor material doped to a first conductivity type, the emitter layer having first and second spaced regions,
   (b) first and second semi-insulating regions of the first semiconductor material being doped to be semi-insulating, each of the first and second semi-insulating regions having a portion circumscribing each of said first and second spaced regions, respectively, of said emitter layer, said first and second semi-insulating regions being spaced apart from each other within said emitter layer and extending downwardly to a predetermined depth through a portion of the overall thickness of said emitter layer,
   (c) first and second active base regions each directly overlying, substantially aligned and coextensive with said portion of each of said first and second spaced regions, respectively, of said emitter layer, said active base regions being of a second semiconductor material and being doped to a second conductivity type which is opposite to said first conductivity type, said second semiconductor material having an energy bandgap which is less than an energy bandgap of said first semiconductor material,
   (d) first and second collector regions directly overlying, substantially aligned and coextensive with said frost and second active base regions, respectively, said collector regions being of said second semiconductor material and being doped to be said first conductivity type, and
   (e) first and second base contact regions on said semi-insulating regions, respectively, the base contact regions being of said second semiconductor material and being doped to said second conductivity type to a concentration with is higher than a concentration to which said active base regions are doped, said first base contact region surrounding said first active base region and said first collector region and being spaced apart from said second active base region surrounding said second base contact region and said second collector region, said first base contact region and said first spaced region of said emitter layer forming a substantial p-n junction therebetween and said second base contact region and said second spaced region of said emitter layer forming a substantial p-n junction therebetween.

3. A bipolar transistor comprising
   (a) an emitter layer of a first semiconductor material doped to a first conductivity type, the emitter layer having first and second spaced regions,
   (b) first and second semi-insulating regions of the first semiconductor material being doped to be semi-insulating, each of the first and second semi-insulating regions having a portion circumscribing each of said first and second spaced regions, respectively, of said emitter layer, apart from each other within said emitter layer and extending downward throughout the overall thickness of said emitter layer,
   (c) first and second active base regions each directly overlying, substantially aligned and coextensive with said portions of said emitter layer, respectively, said active base regions being of a second semiconductor material and being doped to be a second conductivity type which is opposite to said first conductivity type, said second semiconductor material having an energy bandgap which is less than an energy bandgap of said first semiconductor material,
   (d) first and second collector regions directly overlying, substantially aligned and coextensive with said first and second active base regions, respectively, said collector regions being of said second semiconductor material and being doped to said first conductivity type, and
   (e) first and second base contact regions on said semi-insulating regions, respectively, the base contact regions being of said second semiconductor material and being doped to be said second conductivity type to a concentration which is higher than a concentration to which said active base regions are doped, said first base contact region surrounding said first active base region and said first collector region and being spaced part from said second active base region surrounding said second base contact region and said second collector region, said collector regions and said base contact regions having respective surfaces substantially flush with each other, said first base contact region and said first spaced region of said emitter layer forming a substantial p-n junction therebetween and said second base contact region and said second spaced region of said emitter layer fording a substantial p-n junction therebetween.

4. A transistor device as set forth in claim 1, in which said emitter region is of gallium-arsenide, said semi-insulating region is of p-type germanium and said third layer is of germanium.

5. A transistor device as set forth in claim 1, in which said emitter region is of n-type gallium phosphide, said semi-insulating region is of silicon and said third layer is of silicon.

6. A pair of bipolar transistors as set forth in claim 2, in which said emitter layer is of gallium-arsenide, each of said semi-insulating regions is of germanium and each of said base contact regions is of germanium.

7. A pair of bipolar transistors as set forth in claim 2, in which said emitter layer is of gallium phosphide, each of said semi-insulating regions is of silicon and each of said base contact regions is of silicon.

8. A pair of bipolar transistors as set forth in claim 2, in which each of said semi-insulating regions and each of said base contact regions are formed with a trench exposing a portion of said first layer, said active base regions being spaced apart from each other across said trench and said collector regions being spaced apart from each other across said trench.

* * * * *